United States Patent [19]

Nomi et al.

[11] Patent Number: 5,691,242

[45] Date of Patent: Nov. 25, 1997

[54] METHOD FOR MAKING AN ELECTRONIC COMPONENT HAVING AN ORGANIC SUBSTRATE

[75] Inventors: Victor K. Nomi, Round Rock; John R. Pastore, Leander; Charles G. Bigler, Austin, all of Tex.

[73] Assignee: Motorola, Inc., Schaumburg, Ill.

[21] Appl. No.: 606,981

[22] Filed: Feb. 26, 1996

[51] Int. Cl.$^6$ ............................................. H01L 21/60
[52] U.S. Cl. ........................ 437/206; 437/217; 437/220
[58] Field of Search ................................. 437/206, 217, 437/220; 257/668, 671, 677; 29/827

[56] References Cited

U.S. PATENT DOCUMENTS

| | | | |
|---|---|---|---|
| 5,067,229 | 11/1991 | Nakamura et al. | 437/206 |
| 5,403,785 | 4/1995 | Arai et al. | 437/206 |
| 5,429,992 | 7/1995 | Abott et al. | 437/206 |
| 5,633,205 | 5/1997 | Tsuchiya et al. | 437/217 |

FOREIGN PATENT DOCUMENTS

| | | |
|---|---|---|
| 2-086138 | 3/1990 | Japan . |
| 3-212963 | 9/1991 | Japan . |

*Primary Examiner*—John Niebling
*Assistant Examiner*—Thomas G. Bilodeau
*Attorney, Agent, or Firm*—Patricia S. Goddard

[57] ABSTRACT

A method for packaging an integrated circuit begins by providing an organic substrate (310) having at least one device site (312). Within each device site, one or more electronic devices (532) is mounted. Around the device site, slots (316) and corner holes (318) are formed. In one embodiment, a negative feature, such as a notch (326), is formed in the substrate along the inner edge (315) of the slots. After the electronic device is mounted and encapsulated in a plastic package body (320), the device is excised from the substrate by punching corner regions of a final package perimeter (317). The placement of the slots, corner holes, and notches results in a punch periphery that is free from burrs, provides maximum active interconnect area, and minimizes surface and/or edge damage during the punch operation. Instead of forming notches, a positive feature, such as a protrusion (426) can be incorporated into a punching tool segment (428) to provide the same benefits.

28 Claims, 5 Drawing Sheets

FIG.2 —PRIOR ART—

METHOD FOR MAKING AN ELECTRONIC COMPONENT HAVING AN ORGANIC SUBSTRATE

FIELD OF THE INVENTION

The present invention relates to making electronic devices in general, and more specifically to making electronic components, including semiconductor devices, which incorporate organic substrates.

BACKGROUND OF THE INVENTION

Plastic Ball Grid Array (PBGA) packages for electronic components utilize an organic substrate for routing input/output terminals (I/Os) of the device to a user's board. The components are typically assembled by mounting electronic devices at individual device sites on a substrate strip, encapsulating the devices in plastic, and excising or singulating the individual devices from the strip in a punching operation. The punching operation can pose a variety of problems, including burr formation, non-uniform final package dimensions, and loss of usable substrate area, as further explained below in reference to prior art FIGS. 1-6.

FIG. 1 illustrates a prior art organic substrate 10 which contains a plurality of sites which are used to mount integrated circuit die or other electronic devices. FIG. 1 illustrates a single device site 12. Device site 12 includes an excise perimeter 17 and four drilled holes 18. Device site 12 also has a plurality of slots 14 which are formed in the substrate so that conductive traces 21 are electrically isolated from one another. The traces are initially short circuited together and to a plating bus (not illustrated) so that the traces can be electrolytically plated. An integrated circuit die or other electronic device (which is hidden in the view of FIG. 1) is mounted on substrate 10 within excise perimeter 17. After electrically coupling the die to the conductive traces of the substrate 10, the device is encapsulated in a plastic package body 22. The packaged device is then punched out from the substrate 10 along excise 17 to form a final package outline. Excise perimeter 17 intersects the four holes 18 at the corners of the device site 12.

In a substrate design such as that illustrated in FIG. 1, about 98% of the excise perimeter 17 of device site 12 contains substrate material which must be punched by a punching tool to form the final package outline. The large percentage of substrate material along the perimeter of device site 12 can result in significant surface and/or edge damage along the perimeter of the final package outline. Such damage can lead to electrical reliability problems in the final device. Another disadvantage of having such a large amount of substrate material being punched is that a large punch substrate support area is required inside of the excise perimeter 17 to support the substrate during punching. Such a significant support area will consume area on either the top side or the bottom side of substrate 10 around excise perimeter 17 which could otherwise be used for conductive interconnects (such as traces, vias, solder balls, etc.) on the substrate 10.

One known solution to the problem of causing surface and/or edge damage to the final package outline is to move the slots closer to the excise perimeter, particularly such that an inner edge of each slot defines the outer dimension of the final package. Such an improved substrate design is illustrated in FIG. 2 as a substrate 110. An inner edge 115 of slots 116 defines the final package perimeter 117. A final package formed from the improved substrate 110 is thus known as a "slot-defined" package. (Note, inner edges 115 are only illustrated as a dashed line in FIG. 2 to indicate that the inner edges are coincident with the final package perimeter 117.) A benefit of a slot-defined package is that only substrate material in between adjacent ends of slots 116, located at the corners of a device site 112, near corner holes 118, is actually sheared during the punching operation. More specifically, a corner punch only shears substrate material which exists between the ends of slots 116 and corner holes 118 along package perimeter 117. (Note that the final package outline will not be 90° at the corners of the device site as package perimeter 117 suggests. Instead, the corners of the package will have an indentation of approximately a quarter of a circle due to the presence of corner holes 118 prior to punching the corners.)

Because only corner punching is utilized, the amount of material punched along the package perimeter 117 of device site 112 after forming a package body 120 in the substrate of FIG. 2 is roughly 5% of the total substrate material around the perimeter of the device site, instead of 98% of the total substrate material around the perimeter of the device site 12 in the substrate of FIG. 1. Because less material is physically being sheared in punching a slot-defined package, surface and/or edge damage is minimized. The slots edges which make up a large portion of the final package perimeter are smooth relative to edges formed by punching because the slots are formed by the substrate manufacturer using a drilling or routing operation, which causes much less damage to the surface and/or edge of the substrate as compared to punching.

A typical punching tool for excising the device from the substrate 110 utilizes a right angle cutting edge corresponding to each corner of the device site. Ideally, the punching tool would punch the corner areas of package perimeter 117 in-line with the inner edge 115 of each slot 116. However because perfect alignment cannot be expected, burrs can result even with a slight misalignment of the punching tool. An example of possible burr formation is shown in FIG. 3, wherein corner punching tool segments 125 are slightly misaligned with an inner edge 115 of slot 116 to create a burr in a region 129. As a result of the misalignment, the punching tool has to cut a thin, unsupported strip of substrate material along the inner edge of the slot, leading to burr formation.

To prevent formation of burrs in a slot defined package, the inner edges 115 of slots 116 can intentionally be designed to fall within the excise perimeter 117 to avoid having to cut a thin strip of unsupported substrate material. Inner edges 115 of slots 116 which are inset from the device site perimeter are illustrated in an exploded view in FIG. 4. One problem with positioning the inner edge 115 of each slot 116 inside the excise perimeter 117 of the device site is that the length and width dimensions of the package after punching vary depending upon where the measurement is taken. For example, a final package outline of a device as excised from substrate 110 is shown in FIG. 5, wherein a length L and a width W are different from a length L' and a width W'. Such non-uniform package dimensions lead to problems with automated handling equipment. An additional problem with designing the substrate 110 to have slots 116 which have inner edges 115 that fall inside excise perimeter 117 is that active area which could otherwise be used for conductive interconnects (not illustrated) is lost where the slots 116 exist inside the excise perimeter. In FIG. 5, this lost area is represented as area 119.

FIG. 6 illustrates another improved substrate 210 which is also slot-defined, but which regains lost substrate area by positioning the inner edges of the slots coincident with the excise perimeter and by using a punching tool which shears the substrate at an angle, and only at the corners of a device site 212. By restricting the punching tool to punching only the corners of the device site, and punching the corners at an angle, burrs can be eliminated without perfect punching tool alignment. For example, as shown in FIG. 6, device site 212 is punched at corners 219 at an angle of approximately 45° after forming a package body 220 over a mounted device. (Note that corner holes are not needed when using an angled corner cut, since the primary purpose of the corner holes is to avoid having to punch a right angle). As a result of punching, the final package outline corresponds to a package perimeter 217. The corners of the package perimeter are defined by the punched corners 219, while the major sides of the package perimeter are defined by inner edges 215 of slots 216. (Note, inner edges 215 are only illustrated as a dashed line to indicate that the inner edges are coincident with the final package perimeter 217.) The chamfered corners enable the inner edges 215 of slots 216 to define the maximum outer dimensions of the final package body. Thus, the package outline has a uniform length and width. However, a disadvantage in chamfering the corners is that some area of the substrate, shown in FIG. 6 as area 224, is lost which could otherwise be used for active interconnects (not illustrated). While the substrate area 224 lost as a result of chamfering is not as great as that lost by area 119 in substrate 110 having inset slots, any unnecessary loss of useful substrate area is undesirable.

Accordingly, a new method for excising an electronic device from an organic substrate is needed which is slot-defined to minimize surface and/or edge damage while maximizing the amount of substrate area which can be used for active interconnect without risk of forming burrs.

DETAILED DESCRIPTION OF A PREFERRED EMBODIMENT

Generally, the present invention provides an improved method for making an electronic device having an organic substrate wherein (1) the amount of substrate material sheared during singulation of the electronic device from the substrate is minimized, (2) the area of the substrate available for active interconnects is maximized, and (3) burrs along the final package outline are eliminated. These advantages over prior art methods are achieved in the present invention by either incorporating a negative feature into an organic substrate or incorporating a positive feature into a punching tool which creates an alignment tolerance window that is compatible with a typical punching operation.

These and other features of the present invention can further be understood with reference to subsequent figures. It is important to point out that the illustrations may not necessarily be drawn to scale, and that there may be other embodiments of the present invention which are not specifically illustrated.

Figure 1:
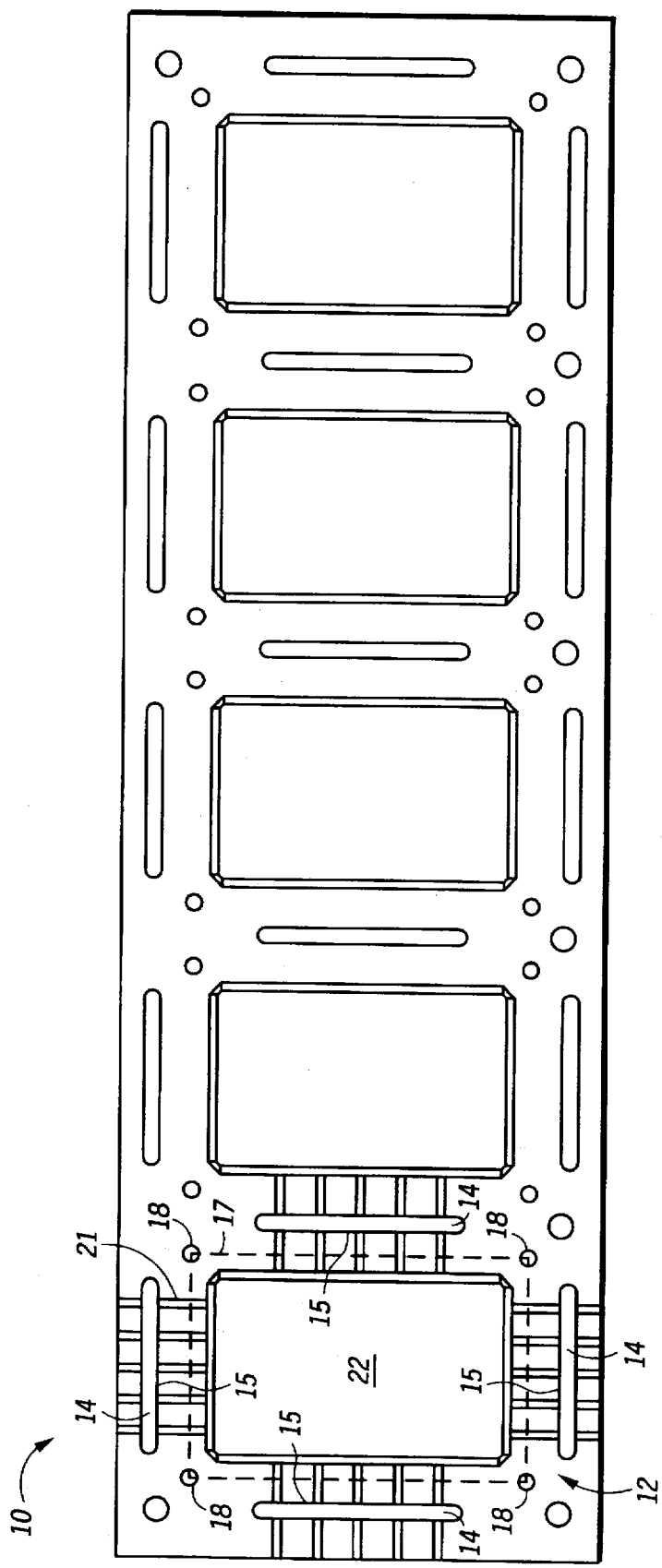
FIG. 1 illustrates, in a top perspective view, a prior art organic substrate where a final package outline of an electronic device as excised from the substrate is defined by a punching operation.
Figure 2:
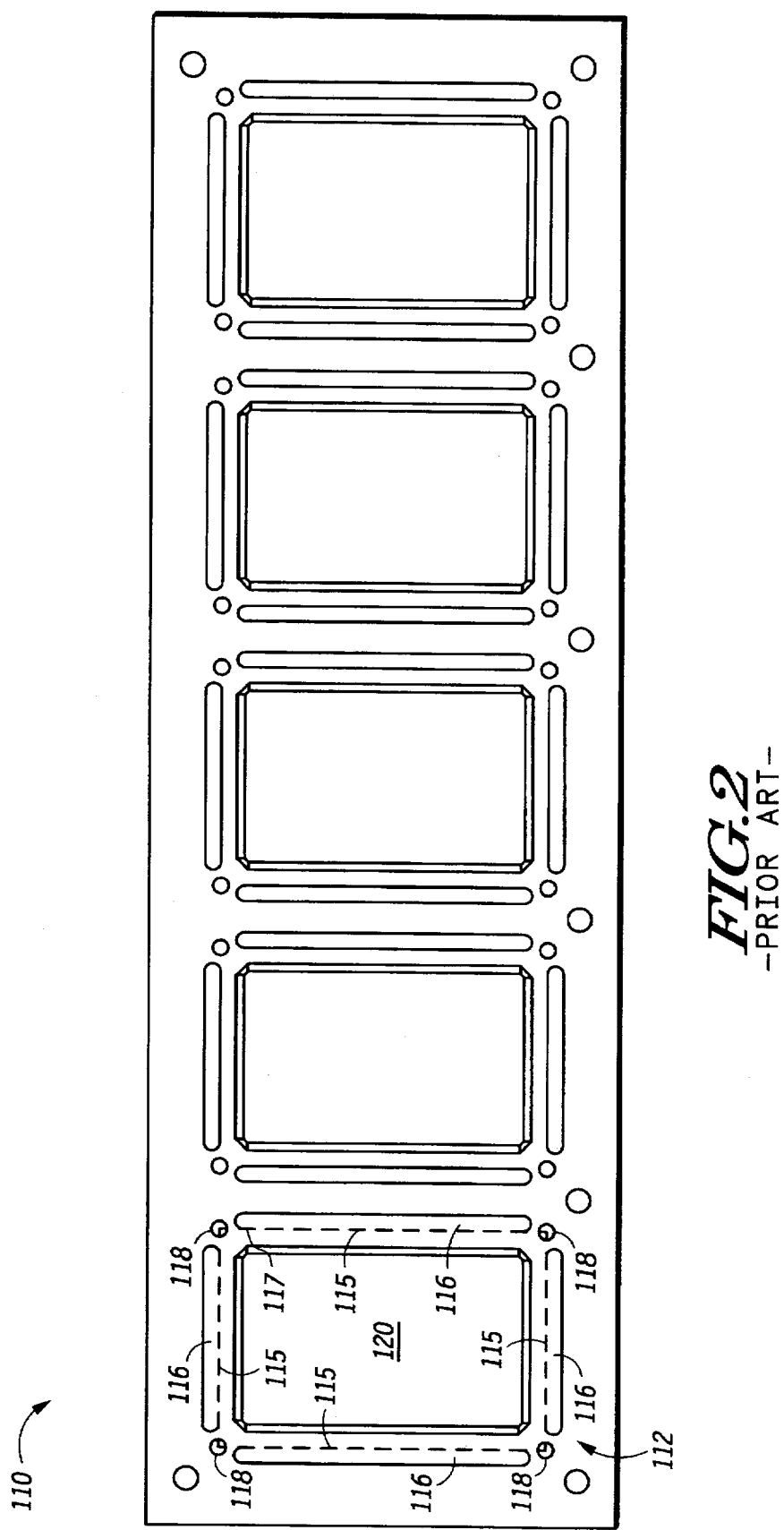
FIG. 2 illustrates, in a top perspective view, a prior art, slot-defined organic substrate where a final package outline of an electronic device as excised from the substrate is defined by both a punching operation and slots.
Figure 3:
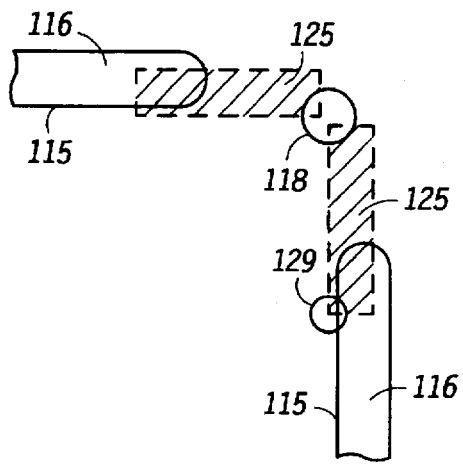
FIG. 3 illustrates, in an exploded corner view, how burrs can be formed in a prior art punching method using the substrate of FIG. 2.
Figure 4:
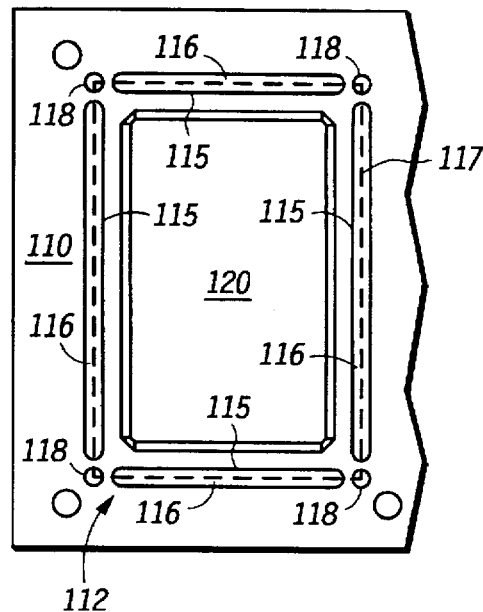
FIG. 4 illustrates a view of a single device site of the substrate of FIG. 2 having inset slots in accordance with the prior art.
Figure 5:
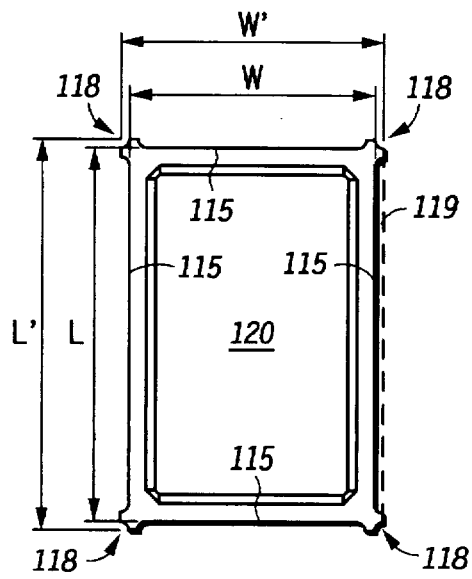
FIG. 5 illustrates, in a top perspective view, the final package outline of an electronic device as excised from the substrate of FIG. 4.
Figure 6:
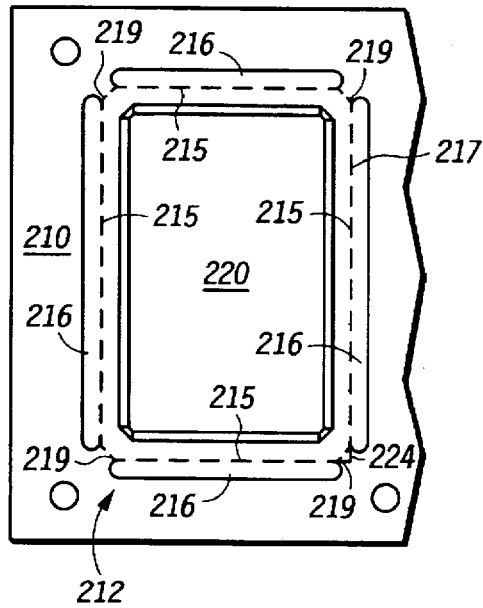
FIG. 6 illustrates, in a view of a single device site of a substrate, a prior art method for punching a slot-defined substrate which eliminates burr formation by using an angled punching tool only at corners of a device site.
Figure 7:
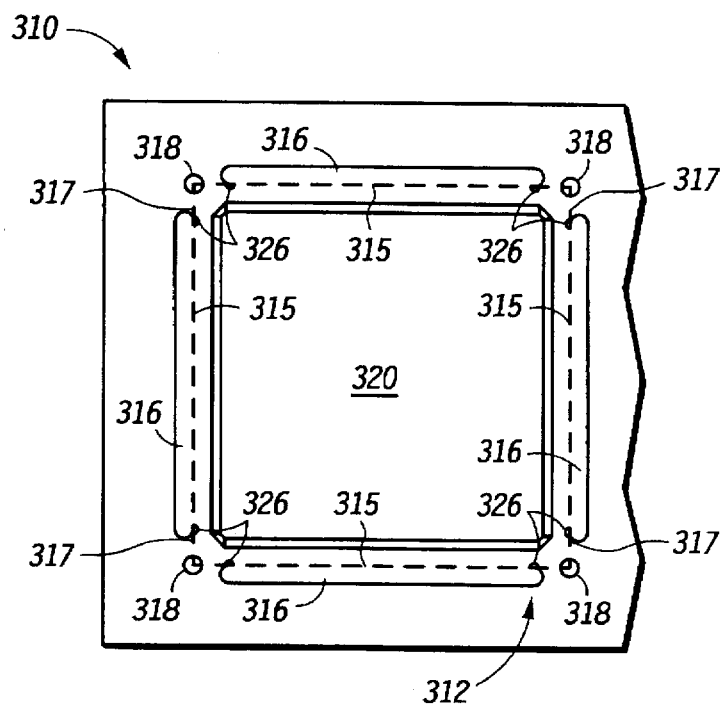
FIG. 7 illustrates, in a top perspective view of a single device site, a new organic substrate configuration including notches in accordance with one embodiment of the present invention.

FIG. 7 illustrates a portion of an organic substrate 310 in accordance with the present invention which contains a device site 312, which in a preferred embodiment is a site for receiving a semiconductor die. As understood by one familiar with organic substrate packaging, substrate 310 is likely to be in a strip form and include a plurality of such device sites, although for the sake of clarity only one device site 312 is illustrated. In a preferred form, organic substrate 310 is a resin-based, fiber-reinforced substrate having clad metal layers which are patterned to form a plurality of conductive traces and other conductive features. The conductive traces are preferably formed on both a top and bottom surface of the substrate. The top and bottom traces are electrically coupled together by conductive vias which extend through the substrate. The conductive traces are not illustrated in FIG. 7 for the sake of clarity, but are shown in a cross-sectional view of a final packaged electronic component in accordance with the present invention in FIG. 12.

As illustrated, substrate 310 includes holes 318 which are positioned at four corner locations within device site 312. The holes 318 are optionally provided to eliminate the need to punch a right angle in substrate 310 at the corners of the device site 312. In addition to the corner holes 318, four slots 316 are positioned around device site 312; one slot being provided along each side of the device site such that an inner edge of each slot defines a final package perimeter 317. (Note, inner edges 315 are only illustrated as a dashed line to indicate that the inner edges are coincident with the final package perimeter 317.) Due to the location of the inner edges 315 of slots 316 and the location of corner holes 318, a punching tool only needs to shear a small portion of the perimeter of device site 312. Specifically, punching is restricted to only portions of the substrate located betweens ends of the slots and corner holes 318. In addition to minimizing the amount of substrate material being punched, the configuration of the substrate 310 in FIG. 7 maximizes the area of the substrate available for active interconnects because the inner edge 315 of slots 316 define a maximum length and width of a final package outline. Inner edges 315 of the slots are not inset from the perimeter 317.

In accordance with the present invention, substrate 310 also includes one or more negative features (i.e. holes or cut-outs in the substrate) which help to eliminate burrs along edges of the final packaged device. In FIG. 7, these negative features are illustrated as notches 326. The notches 326 are preferably positioned along the inner edges 315 of the slots 316 and at or near both ends of the slots. In a preferred form, the notches 326 are drilled in substrate 310 at the same time other holes, such as corner holes 318 or tooling holes (not shown) are drilled, and before the formation of slots 316. Drilling is preferred to minimize cost of substrate manufacturing while also minimizing damage to the substrate 310. Because notches 326 are drilled, their initial shape will most likely be circular, but upon creating slots, the notches will become semi-circular in shape since the notches preferably intersect the inner edge 315 of the slots 316. Alternatively, the notches 326 could be formed by routing the substrate 310 at the same time the slot 316 is routed. Although the particular size and shape of notches 326 is not critical, it is preferred the notches be as small as possible to minimize the removal of substrate material available for active interconnects, while allowing for a manufacturable punching tool alignment tolerance window as later explained below in reference to FIG. 9. As an example of a suitable negative feature dimension, notch 326 can be a drilled hole having a diameter of 0.3 millimeters.

Figures 8, 9:
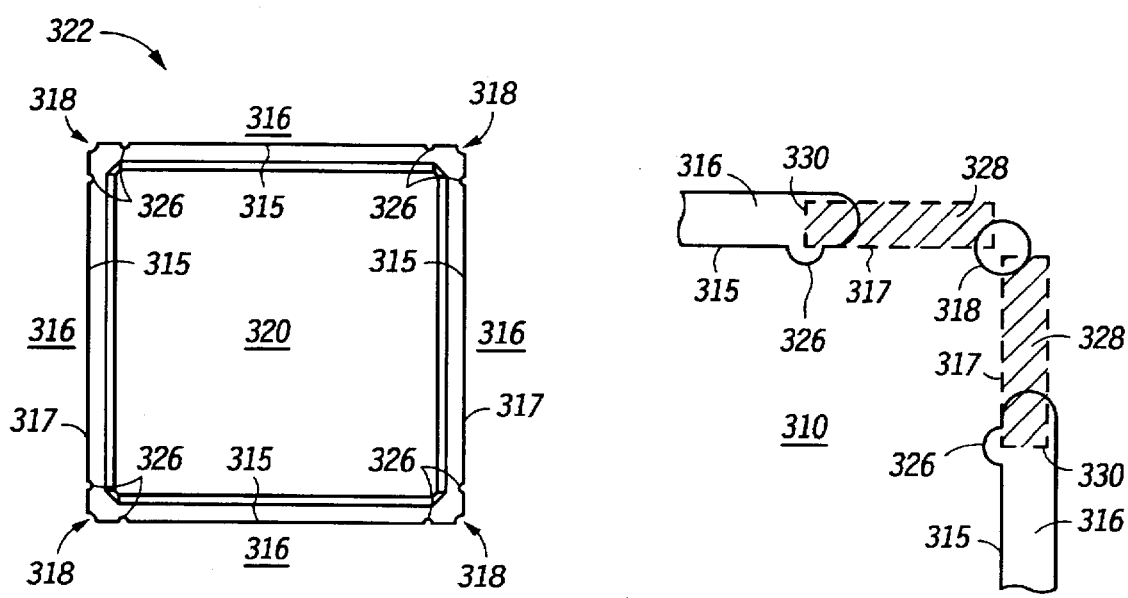
FIG. 8 illustrates, in a top perspective view, an electronic device after being singulated from the substrate of FIG. 7.
FIGS. 9 and 10 illustrate, in a magnified view of a corner of the device site of FIG. 7, how a notch and a slot are used in accordance with the present invention to prevent the formation of burrs and maximize usable substrate area.

FIG. 8 illustrates an electronic component 322 after being excised from the substrate 310 of FIG. 7, following encapsulation of the device by a plastic package body 320. Excision is preferably done by a punching operation using a punching tool which is segmented into corner punching segments, as will become apparent below in discussions of FIG. 9. After the process of punching, portions of the corner holes 318 are still visible at corners of the final packaged electronic component 322. In addition, small portions of the notches 326 which are insignificant in terms of active substrate area are also located along a periphery of the final packaged component 322. As illustrated in FIG. 8, the outline of the final package is slot-defined, wherein inner edges 315 of slots 316 form a majority of the package perimeter and define maximum outer dimensions of the package. The presence of notches 326 eliminates the need to inset the inner edges 315 of the slots 316 as in prior art punching methods and substrate designs. Thus, substrate area which would be lost by insetting the slots is maintained in the final package substrate, with only minimal loss of substrate area due to the presence of notches 326.

FIG. 9 illustrates how notches 326 of substrate 310 eliminate the formation of burrs during a punching operation. Notches 326 are formed along inner edges 315 of the slots 316 near ends of the slots. In a preferred embodiment, the substrate is punched by eight bar-shaped segments of a punching tool, two per corner of the device site. Two such segments 328 are shown in FIG. 9 in relation to one corner of a device site of substrate 310. In an alternative embodiment, four L-shaped punch tool segments could be used. Inside surfaces of the punching tool segment 328 create the corner portion of the final package outline periphery, punching the device site package perimeter 317. In accordance with a preferred embodiment of the invention, ends 330 of the punching tool segments 328 terminate within a circumference of the notches 326. Thus, the dimensions of the notches or other negative feature, define the punching tool alignment tolerance window. The presence of notches 326 adjacent to ends 330 of the punching tool segments 328 eliminates the possibility of burr formation because the ends of the punching tool segments do not have to shear any substrate material.

Figure 10:
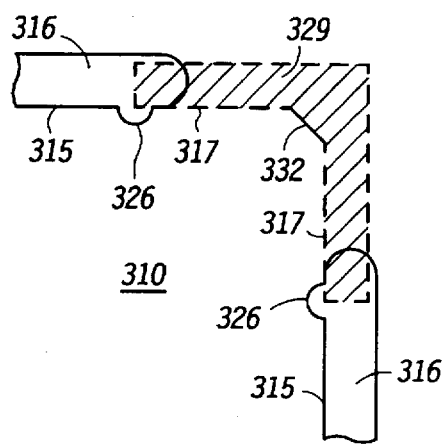

FIG. 10 illustrates an alternate embodiment of the present invention, wherein a corner portion 332 of a punching tool segment 329 includes an angle which creates a chamfered corner in the excised package substrate. In this embodiment, no corner hole 318 is included in the substrate. Instead of a corner hole, the punching tool is manufactured to have an angle (e.g. 45°) which is an alternative method for eliminating the need to punch the substrate material at a right angle. While the punching methods described in reference to FIGS. 9 and 10 contemplate a need to avoid punching a right angle in an organic substrate, it is possible that punching methods will be developed which can punch right angles in the substrate without significant damage to the substrate. Such methods will also benefit from practicing the present invention.

Figure 11:
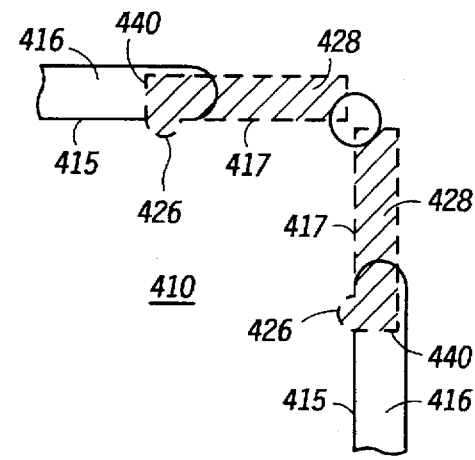
FIG. 11 illustrates a corner segment of a punching tool having positive features to punch an organic substrate without forming burrs in accordance with another embodiment of the present invention.

In FIGS. 9 and 10, the notches 326 are either drilled or routed within the substrate 310 illustrated in FIG. 7. In other words, a negative feature or opening is physically drilled or formed within the substrate material. In an alternative embodiment, positive features, such as protrusions, can be incorporated into a punching tool to achieve the same objectives as the incorporation of negative features in the substrate. FIG. 11 illustrates positive features in two punching tool segments 428, wherein the positive features take the form of rounded protrusions 426 at or near the ends 440 of the punching tool segments which are closest to slots 416. A substrate 410 punched by punching tool segment 428 does not include notches along the inner edges 415 of slots 416. Instead, the punching tool segment 428 is formed to have protrusions 426 at each end of the punching tool segments nearest the slots, wherein the protrusions extend toward the device site and inside the outer edge of the final package body outline, as defined by a final package perimeter 417. The presence of protrusions 426 in the punching tool segment provides the same excise alignment tolerance window as if a negative feature were included in the substrate (for example as in the substrate 310 of FIGS. 9 and 10) because the punching tool is not attempting to shear a thin strip of the substrate material along inner edges of the slots. Therefore, either positive features formed on the punching tool or negative features formed in the substrate may be used to achieve the advantages of the present invention.

Figure 12:
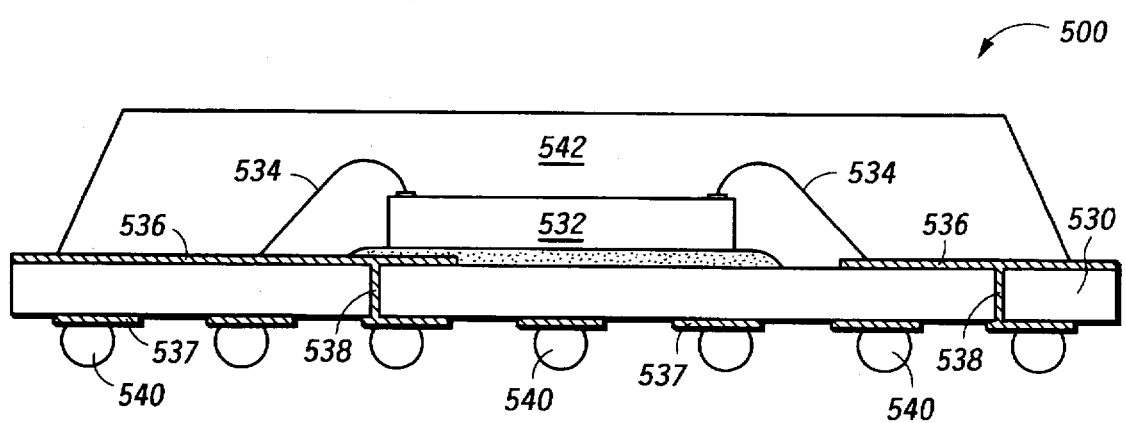
FIG. 12 illustrates, in a cross-sectional view, a singulated and packaged semiconductor device formed in accordance with the present invention.

FIG. 12 illustrates in a cross-sectional view a packaged electronic component 500, after an electronic device 532 has been mounted to an organic substrate 530, encapsulated with a plastic resin material to form a package body 542, and excised or punched using a process in accordance with the present invention as taught herein. The final package outline of component 500 is defined by inner edges of substrate slots, notches or negative features, and corner excise perimeters as explained previously. Electronic component 500 includes one or more electronic devices 532, such as a semiconductor integrated circuit die or discrete device. The device is electrically coupled to conductive traces 536 formed on the top surface of the substrate. As illustrated in FIG. 12, the electronic device 532 is electrically coupled to conductive traces 536 through the use of wire bonds 534, although other coupling methods such as conductive bumps, TAB (tape automated bonds), or the like could instead be used. The conductive traces 536 on the top surface of the substrate 530 are electrically routed to conductive traces 537 on an opposing bottom surface of the substrate 530 by plated through holes or vias 538. In mounting the electronic component 500 to a user's board, either the conductive traces 537 can be attached to the board, for instance using solder, or a plurality of conductive balls 540, e.g. solder balls, can be attached to the substrate 530 in accordance with conventional practices.

In accordance with a preferred embodiment, notches used in an organic substrate are drilled at the same time vias 538 are drilled. A substrate typically includes a plurality of vias, some with varying diameters. Vias of varying diameters are typically drilled at different times. To save steps in the manufacture of the substrate, it is preferred that notches are drilled at the same time as any one of the vias. Therefore, ideally any notches used would have a diameter equal to any diameter of any via formed in the substrate, however any particular size of the notch is not required. It also is preferred that the notches be kept small to avoid using substrate area which is otherwise available for active interconnect. As an example, a notch can suitably be about 0.3 mm in diameter as drilled. (Although upon forming the slot, the final notch size will be smaller).

From the foregoing it is apparent that a method for making an electronic component having an organic substrate has been described which overcomes problems existing in prior art organic substrate device manufacturing. Specifically, an organic substrate as used in accordance with the present invention utilizes either a negative feature (e.g. a rounded notch) in the substrate or a positive feature (e.g. a rounded protrusion) in the punching tool, to create an alignment tolerance window for corner punching each device site from the substrate. The alignment tolerance window eliminates the formation of burrs along the final package perimeter near the punched corners, while at the same time maximizes the amount of area of the substrate available for routing active interconnect. Morever, in practicing the present invention, the final package outline has uniform dimensions since the package is slot-defined without having inner edges of the slots inset from the excise perimeter.

Although the invention has been described and illustrated with reference to specific embodiments, it is not intended that the invention be limited to these illustrative embodiments. Those skilled in the art will recognize that modifications and variations can be made without departing from the spirit and scope of this invention. For example, the present invention is not limited to the material of the organic substrate used. Nor is the invention restricted by the type or number of the electronic devices housed within the excised package. Furthermore, neither the device mounting configuration (top mounted, active side up) nor the electrical routing patterns within the substrate are restricted by the invention. For example, device can be flip-chip mounted on a bottom side of the substrate and the substrate can include internal heat sinking or reference planes. Therefore it is intended that this invention encompass all such variations and modifications as fall within the scope of the appended claims.

We claim:

1. A method for making an electronic component comprising the steps of:

providing an organic substrate having a device site, the device site having a plurality of conductive traces and having a slot formed along each of four sides, wherein an inner edge of each slot defines an outer dimension of a final package body, wherein each slot has two ends, and wherein a feature is formed in the organic substrate and positioned along the inner edge near each of the two ends of each slot;

mounting an electronic device within the device site;

electrically coupling the electronic device to the plurality of conductive traces; and excising the final package body from the organic substrate, wherein the feature prevents damage to an outer edge of the final package body during excising.

2. The method of claim 1 wherein the step of providing an organic substrate comprises providing the organic substrate wherein the feature is a negative feature.

3. The method of claim 2 wherein the step of providing an organic substrate comprises providing the organic substrate wherein the negative feature has a rounded edge.

4. The method of claim 2 wherein the step of providing an organic substrate comprises providing the organic substrate wherein the negative feature has a semi-circular shape.

5. The method of claim 1 wherein the step of mounting an electronic component comprises mounting a semiconductor die.

6. The method of claim 1 wherein the step of excising comprises:

providing a punching tool; and punching the final package body from the organic substrate, wherein during punching, the punching tool intersects the feature.

7. The method of claim 6 wherein the step of providing a punching tool comprises providing a punching tool having at least one punch segment located at each of four corners of the final package body, and wherein the step of punching comprises punching the organic substrate only at each of four corner areas of the device site.

8. The method of claim 6 wherein the step of providing an organic substrate comprises providing an organic substrate having eight features like the feature, and wherein the step of providing a punching tool comprises providing a punching tool having eight end portions, wherein during the step of punching, an end portion of the eight end portions terminates within one of the eight features of the organic substrate.

9. The method of claim 8 wherein the step of providing a punching tool comprises providing a punching tool wherein each punch segment has a cutting edge which forms a chamfer at a corner of the final package body.

10. The method of claim 1 wherein the step of providing an organic substrate comprises providing an organic substrate having a via formed therein, wherein the via has a first diameter, and wherein the feature is initially a hole formed in the organic substrate having a second diameter substantially equal to the first diameter.

11. A method of making an electronic component comprising the steps of:

providing an organic substrate having a device site defined by a plurality of slots and having a plurality of conductive traces, wherein each slot has an inner edge which defines an outer edge of a final package body and wherein each slot has two opposing ends;

providing a feature near each end of the two opposing ends and along the inner edge of each slot;

mounting an electronic device within the device site;

electrically coupling the electronic device to the plurality of conductive traces; and excising the final package body from the organic substrate, wherein the feature prevents damage to an outer edge of the final package body during excising.

12. The method of claim 11 wherein the step of providing a feature comprises a negative feature formed in the organic substrate.

13. The method of claim 12 wherein the step of providing an organic substrate comprises providing the organic substrate wherein the negative feature has a semi-circular shape.

14. The method of claim 12 wherein the step of providing a feature comprises providing a drilled hole in the organic substrate.

15. The method of claim 14 wherein the step of providing an organic substrate comprises providing an organic substrate having a via formed therein, wherein the via has a first diameter, and the drilled hole has a second diameter substantially equal to the first diameter.

16. The method of claim 11 wherein the step of excising comprises:

providing a punching tool;

punching the final package body from the organic substrate; and wherein the step of providing a feature comprises providing a positive feature in the punching tool.

17. The method of claim 16 wherein the step of providing a punching tool comprises providing a punching tool having at least one punch segment located at each of four corners of the final package body, wherein the at least one punch segment located at each of four corners has an end, and wherein the positive feature is formed near the end.

18. The method of claim 17 wherein the step of providing a positive feature in the punching tool comprises providing a positive feature which is a protrusion having a rounded edge.

19. The method of claim 18 wherein the protrusion at the end of the at least one punch segment located at each of four corners protrudes toward the device site and inside the outer edge of the final package body.

20. A method for making a semiconductor device comprising the steps of:

providing an organic substrate having a device site, the device site having a plurality of conductive traces, four sides, and a slot formed along each of the four sides, wherein an inner edge of each slot defines an outer dimension of a final package body, wherein each slot has two ends and wherein a notch is formed along the inner edge near each of the two ends of each slot;

mounting a semiconductor die within the device site;

electrically coupling the semiconductor die to the plurality of conductive traces; and punching the final package body from the organic substrate, wherein punching is performed at corners of the device site using a punch having a terminating portion which coincides with each notch.

21. The method of claim 20 wherein the step of punching comprises providing a punching tool having eight punch segments, two for punching each of four corners of the device site.

22. The method of claim 20 wherein the step of punching is performed without contacting the organic substrate within the notch.

23. The method of claim 20 wherein the step of providing an organic substrate comprises providing an organic substrate wherein the notch is a rounded notch.

24. The method of claim 20 wherein the step of providing an organic substrate comprises providing an organic substrate having a notch which is initially formed as a drilled hole in the organic substrate.

25. The method of claim 24 wherein the step of providing an organic substrate comprises providing an organic substrate having a via formed therein, wherein the via has a first diameter, and the drilled hole has a second diameter substantially equal to the first diameter.

26. The method of claim 20 further comprising the steps of:

encapsulating the semiconductor die with a plastic resin material; and attaching a plurality of conductive balls to the organic substrate such that the plurality of conductive balls is electrically coupled to the plurality of conductive traces and the semiconductor die.

27. The method of claim 20 wherein the step of punching is performed using a punching tool which has cutting edges that form a right angle at a corner of the final package body.

28. The method of claim 20 wherein the step of punching is performed using a punching tool which has a cutting edge that forms a chamfer at a corner of the final package body.

* * * * *